United States Patent [19]

Honda

[11] Patent Number: 5,455,520
[45] Date of Patent: Oct. 3, 1995

[54] CMOS INPUT CIRCUIT FOR PROVIDING LOGICAL OUTPUT SIGNAL FROM TTL COMPATIBLE INPUT SIGNAL

[75] Inventor: Norifumi Honda, Kitsuki, Japan

[73] Assignee: Texas Instruments Incorporated, Dallas, Tex.

[21] Appl. No.: 121,326

[22] Filed: Sep. 14, 1993

[30] Foreign Application Priority Data

Sep. 14, 1992 [JP] Japan ................................. 4-270917

[51] Int. Cl.$^6$ .............................................. H03K 19/017
[52] U.S. Cl. .............................................. 326/17; 326/86
[58] Field of Search ................................ 307/443, 451, 307/475, 296.5; 326/17, 83, 86

[56] References Cited

U.S. PATENT DOCUMENTS

| | | | |
|---|---|---|---|
| 4,658,156 | 4/1987 | Hashimoto | 307/296.5 X |
| 4,791,323 | 12/1988 | Austin | 307/475 |
| 4,825,106 | 4/1989 | Tipon et al. | 307/451 |
| 4,845,381 | 7/1989 | Cuevas | 307/475 X |
| 5,160,855 | 11/1992 | Dobbenpuhl | 307/296.5 X |
| 5,266,849 | 11/1993 | Kitahara et al. | 307/443 X |

Primary Examiner—David R. Hudspeth
Attorney, Agent, or Firm—William E. Hiller; Richard L. Donaldson

[57] ABSTRACT

An input circuit having a CMOS component which outputs correct logical values without through-current flowing when a high level logic output signal $V_{OH}$ at TTL level is input thereto. The input circuit 1 comprises inverter 20 which outputs by logically inverting the input signals and through-current prevention circuit 21 which stops the flow of current to inverter 20 from power supply $V_{CC}$. The through-current prevention circuit 21 comprises reference voltage generating circuit 10, inverters 12 and 13, and MOS transistors 11a, 11b, 14, and 15. The threshold value voltage of inverter 12 is set slightly lower than the high logic level output $V_{OH}$ at TTL level, and the threshold value voltage of inverter 20 is set lower than inverter 12. By inverter 20 outputting a low-level signal through inverting and stopping the flow of current to inverter 20 by MOS transistor 15 turning OFF when the voltage of signal input to inverter 20 is at approximately the high logic level output at TTL level, through-current does not flow to inverter 20 and a correct logic value is output.

8 Claims, 2 Drawing Sheets

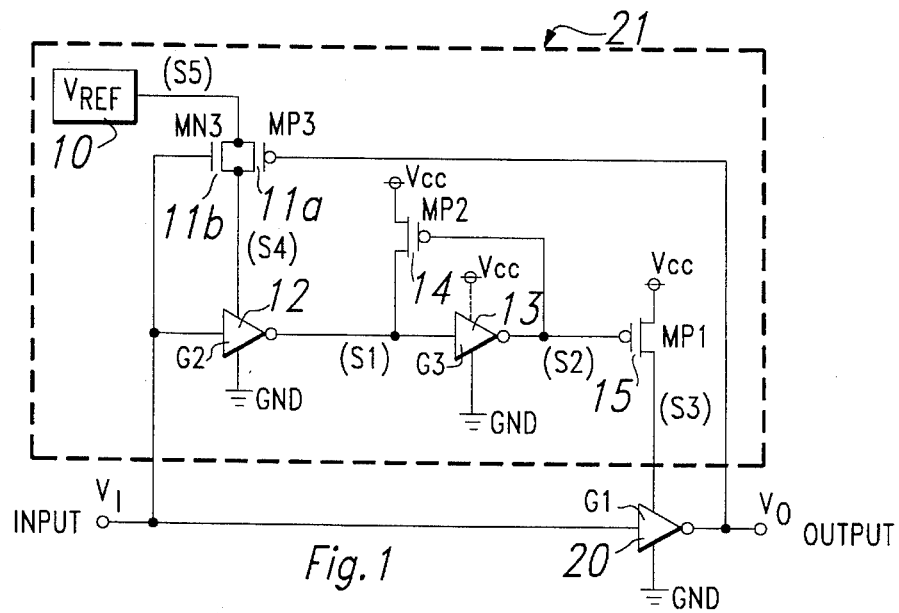
Fig. 1
| STATE<br>INPUT<br>VOLTAGE ($V_1$) | $V_{(S1)}$ | $V_{(S2)}$ | MP1 | OUTPUT<br>VOLTAGE<br>($V_O$) |
|---|---|---|---|---|
| $0 \sim V_{TG1}$ | 1 | 0 | ON | 1 |
| $V_{TG1} \sim V_{TG2}$ | 1 | 0 | ON | 0 |
| $V_{TG2} \sim V_{cc}$ | 0 | 1 | OFF | 0 |
Fig. 2
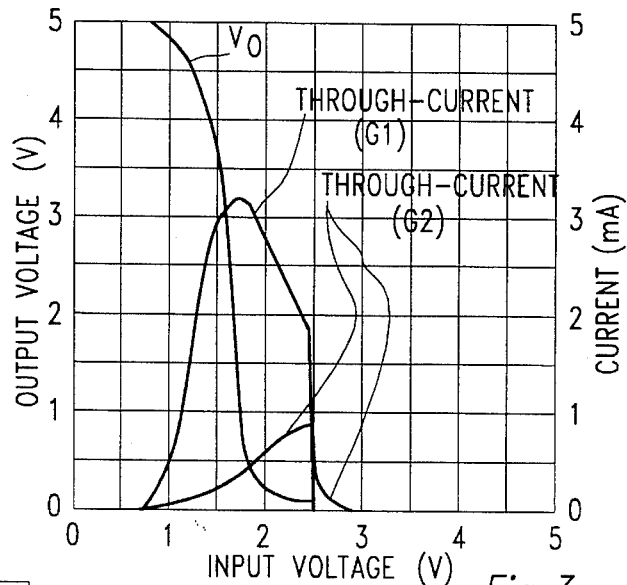
Fig. 3
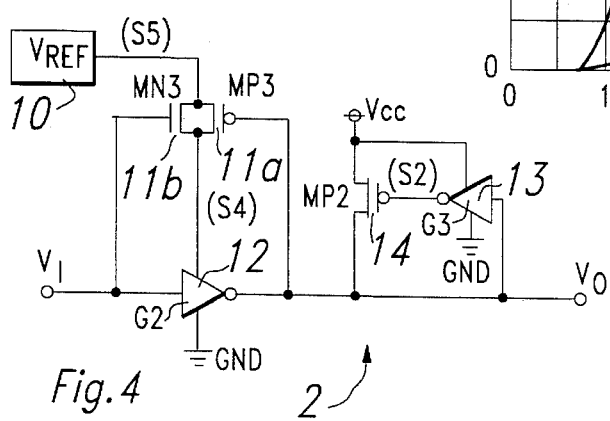
Fig. 4

CMOS INPUT CIRCUIT FOR PROVIDING LOGICAL OUTPUT SIGNAL FROM TTL COMPATIBLE INPUT SIGNAL

The present invention relates to a CMOS input circuit in which the input signal level is TTL compatible or a BiCMOS input circuit composed by mixing CMOS elements and bipolar elements.

Conventionally, a circuit such as that described and shown in FIG. 7 was used as an input circuit of CMOS elements in which the input signal level is TTL compatible or as an input circuit of BiCMOS elements which is composed by mixing CMOS elements and bipolar elements.

FIG. 7 illustrates a conventional CMOS input circuit which is TTL compatible. In FIG. 7, 60 is the TTL driver which outputs TTL level signals, 71 is the input circuit which converts TTL level signals into CMOS level signals, and 74 is the CMOS circuit in which the input/output signal level is the CMOS level. This input circuit 71 is an inverted logic type comprising p-channel MOS transistor 72 and n-channel MOS transistor 73 which outputs the output signals of TTL driver 60 by executing logic inversion.

The operation of conventional CMOS input circuit 71 will now be explained.

When the output signal of TTL driver 60, i.e., the voltage at node S60, is higher than the high level (logic value 1) input logic level $V_{IN}$ of input circuit 71, p-channel MOS transistor 72 takes on the high resistance OFF state, and n-channel MOS transistor 73 takes on the low resistance ON state. Consequently, the output of input circuit 71, i.e., node S71 becomes connected to ground through a low resistance value, and the voltage at node S71 goes low (logic value 0), close to ground potential 0 V).

On the other hand, when the output signal of TTL driver 60, i.e., the voltage at node S60, is lower than the low level (logic value 0) input logic level $V_{IL}$, p-channel MOS transistor 72 takes on the low resistance ON state and n-channel MOS transistor 73 takes on the high resistance OFF state. Consequently, the output of input circuit 71, i.e., node S71, becomes connected to power supply $V_{CC}$ through a low resistance value, and the voltage at node S71 goes high (logic value 1), close to $V_{CC}$.

Conventional input circuit 71 operates as described, and $V_{OH}$ specified as high logic level output at the TTL level is lower than high logic level input $V_{IN}$ at the CMOS level.

When this type of high logic output $V_{OH}$ at TTL level is input to input circuit 71, there are cases when p-channel MOS transistor 72 does not turn OFF completely and p-channel MOS transistor 72 does not turn ON completely, i.e., it enters an intermediate state.

In this state, current (through-current) flows to ground from the power supply through p-channel MOS transistor 72 and n-channel MOS transistor 73.

FIG. 8 is a graph which shows the simulation result of the relation between the through-current, output signal $V_O$, and input signal $V_I$ in conventional input circuit 71 as shown in FIG. 7. In FIG. 8, the horizontal axis indicates the input voltage value (units: V) and the vertical axis indicates the output voltage value (units: V) and the through-current value (units: mA). From this simulation result, it became clear that high through-current is generated when input voltage $V_I$ is about 2 V in the conventional input circuit 71.

Conventional input circuit 71 is constituted as noted above, so that when both p-channel MOS transistor 72 and n-channel MOS transistor 73 enter the intermediate state (a state which is neither the ON state nor the OFF state), there was the problem of through-current flowing through each channel of p-channel MOS transistor 72 and n-channel MOS transistor 73. When the through-current is generated, power consumption of input circuit 71 increases, so that the through-current could be minimized by making the size of p-channel MOS transistor 72 and n-channel MOS transistor 73 small in the conventional input circuit.

When the sizes of p-channel MOS transistor 72 and n-channel MOS transistor 73 constituting input circuit 71 are made small as noted above, there are such problems as the drive capacity of input circuit 71 and the operating speed of input circuit 71 decreasing.

OBJECT OF THE INVENTION

An object of the present invention is to provide a CMOS input circuit in which the through-current is minimal when the TTL level signal is input directly, the drive capacity is high, and the operating speed is high.

SUMMARY OF THE INVENTION

An input circuit in accordance with the present invention has an inverter which is connected to the input terminal and outputs input signals by executing logic inversion, and a control circuit which stops the flow of current to the inverter according to the voltage of the input signal, and the control circuit monitors the voltage of the input signal and stops the flow of current to the inverter when the voltage of the input signal is greater than the threshold voltage of the inverter by a predetermined value.

Thus, the input circuit is constituted as an inverter which is connected to the input terminal and outputs the input signals by executing logic inversion, and a control circuit which is connected to the input terminal and stops the flow of current to the inverter according to the voltage of the input signal. By making the size of the MOS transistors constituting the inverter large, the operating speed of the input circuit is increased and the drive capacity is enhanced. By the control circuit stopping the flow of current to the inverter when the voltage of the input signal is greater than the threshold value voltage of the inverter by a predetermined value, through-current generated when an MOS transistor included in the inverter is not completely OFF is prevented. By the control circuit controlling the voltage which stops the flow of current to the inverter to a value slightly smaller than the high level output logic level ($V_{OH}$), through-current does not flow to the inverter even when a signal of approximately the high logic level output at the TTL level is input to the inverter. Thus, the power consumption of the input circuit is low.

BRIEF DESCRIPTION OF THE DRAWINGS

FIG. 1 is a schematic circuit diagram of a first embodiment of an input circuit in accordance with the present invention.

FIG. 2 is a table showing the state of a p-channel MOS transistor and the logic value at each node of the first embodiment of the input circuit shown in FIG. 1.

FIG. 3 is a graph showing the simulation result of the relationship between through-current, output voltage $V_O$, and input voltage $V_I$ in the first embodiment of the input circuit shown in FIG. 1.

FIG. 4 is a schematic circuit diagram of a second embodiment of the input circuit in accordance with the present invention.

Figures 5, 6, 7, 8:
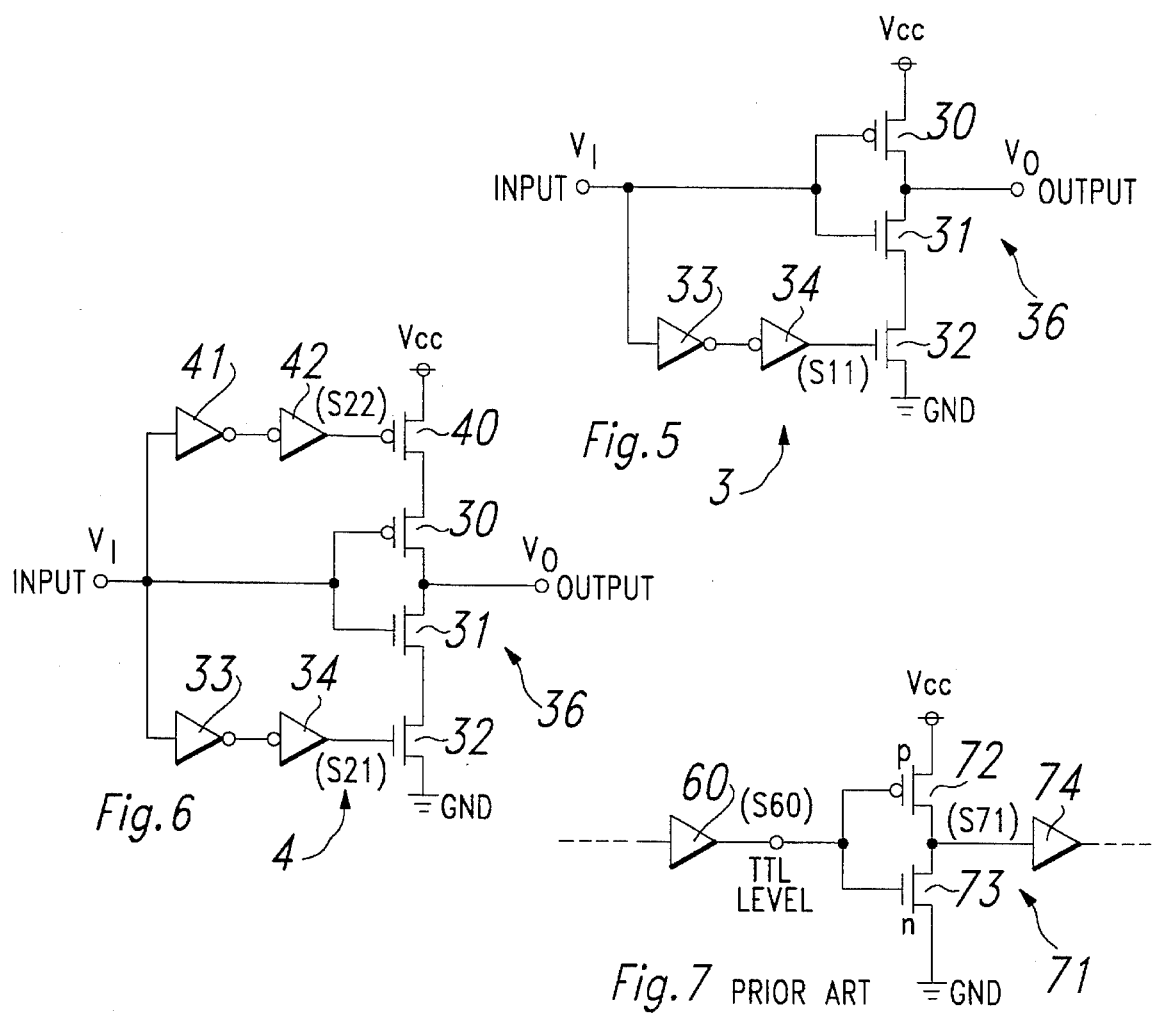
FIG. 5 is a schematic circuit diagram of a third embodiment of the input circuit in accordance with the present invention.
FIG. 6 is a schematic circuit diagram of a fourth embodiment of the input circuit in accordance with the present invention.
FIG. 7 is a schematic circuit diagram of a conventional TTL compatible CMOS input circuit.
FIG. 8 is a graph showing the simulation result of the relationship of through-current, output signal $V_O$, and input signal $V_I$ in the conventional input circuit shown in FIG. 7. In reference numerals as shown in the drawings.

1, 2, 3, 4, 71 . . . input circuits
10 . . . reference voltage generating circuit
11a, 14, 15, 40 . . . p-channel MOS transistors
11b, 32 . . . n-channel MOS transistors
12, 13, 33, 34, 40, 41 . . . inverters
21 . . . through-current prevention circuit
60 . . . TTL driver
74 . . . CMOS circuit

DESCRIPTION OF THE PREFERRED EMBODIMENTS

The invention will be explained with reference to respective embodiments.

FIG. 1 shows a first embodiment of an input circuit in accordance with the present invention. The input circuit 10 comprises inverter 20 and through-current prevention circuit 21, and the input signals are output by being logically inverted. Through-current prevention circuit 21 comprises reference voltage generating circuit 10, p-channel MOS transistors 11a, 14, and 15, n-channel MOS transistor 11b, and inverters 12 and 13. Inverters 12, 13, and 20 are made of p-channel MOS transistor and n-channel MOS transistor, such as inverter (input circuit) 71 of FIG. 7.

When the threshold value of inverter 20 is $V_{TG1}$ and the threshold value of inverter 12 is $V_{TG2}$, each threshold value is set so that equation $$V_{TG1} < V_{TG2} < V_{OH}$$

($V_{OH}$ is the high logic level output at TTL level) is established.

To achieve the latter setting, output voltage (voltage at node S5 of reference voltage generating circuit 10 is set so that equation $$V_{S4} \leq V_{OH} + V_\gamma$$

($V_{OH}$ is the high logic level output at TTL level) is established when the threshold value of the p-channel MOS transistor constituting inverter 12 is $V_\gamma$ and the voltage of node S4 is $V_{S4}$.

Transmission gate 11 comprising p-channel MOS transistor 11a and n-channel MOS transistor 11b is a gate circuit which prevents reversal of the current to reference voltage generating circuit 10. P-channel MOS transistor 11a is controlled by output signal $V_O$, and n-channel MOS transistor 11b is controlled by input signal $V_I$. P-channel MOS transistor 14 is controlled by the output of inverter 13 and is a transistor which pulls up node S1 to power supply voltage $V_{CC}$. P-channel MOS transistor 15 is controlled by the output of inverter 13 and is a transistor which cuts off the feeding of power supply voltage $V_{CC}$ going to inverter 20.

The p-channel MOS transistor and the n-channel MOS transistor comprising inverter 20 have a larger area than p-channel MOS transistor 72 and n-channel MOS transistor 73 comprising conventional input circuit (inverter) 71 shown in FIG. 7, so that inverter 20 has a higher drive capacity than inverter 71 and that the operating speed is high. Also, in order to make the through-current flowing into inverters 12 and 13 small, the area of the p-channel MOS transistor and the n-channel MOS transistor constituting inverters 12 and 13 is designed to be small.

FIG. 2 is a table showing the state of p-channel MOS transistor 15 and the logic value of each node in input circuit 10. In FIG. 2, $V_{TG1}$ is the threshold value voltage of inverter 20, $V_{TG2}$ is the threshold value voltage of inverter 12, $V_{CC}$ is the power supply voltage, $V_{S1}$ is the voltage at node S1, and $V_{S2}$ is the voltage at node S2. When $V_{CC}$ is 5 V, $V_{TG1}$ is set to about 1.5 V and $V_{TG2}$ is set between the high logic level input (3.5 V) at the MOS level and $V_{TG1}$.

The operation of input circuit 1 will now be explained with reference to FIG. 2.

(1) When input voltage $V_I$ is 0-$V_{TG1}$ $V_{S1}$ goes high (logic value 1), $V_{S2}$ goes low (logic value 0), p-channel MOS transistor 15 is ON, and output voltage $V_O$ goes high. Also, p-channel MOS transistor 14 is ON and pulls up node S1.

(2) When input voltage $V_I$ is in the range of $V_{TG1}$-$V_{TG2}$

Inverter 20 logically inverts and output voltage $V_O$ goes low. Here, p-channel MOS transistor 15 is ON and the n-channel MOS transistor constituting inverter 20 are neither completely OFF nor ON, so that inverter 12 logically inverts and through-current flows to inverter 20 until node S1 goes low, i.e., node S2 goes high.

(3) When input voltage $V_I$ is in the range of $V_{TG2}$-$V_{CC}$

Inverters 12 and 13 logically invert and $V_{S1}$ goes low and $V_{S2}$ goes high. By the output of inverter 13 going high, p-channel MOS transistor 15 turns OFF. By p-channel MOS transistor 15 turning OFF, inverter 20 is cut off from $V_{CC}$, so that through-current cannot flow to inverter 20.

Here, the function of p-channel MOS transistor 14 will be discussed. When the potential at node S4 is decreased in order to minimize the through-current of inverter 12, the voltage of the high level output of inverter 12 goes low and through-current flows to inverter 13. Therefore, feedback is applied to node S2 when the potential at node S1 is high to pull up node S1 with p-channel MOS transistor 14 and to prevent the through-current of inverter 13. Therefore, the potential at node S1 changes suddenly from the high level to the low level by the pull up of p-channel MOS transistor 14, so that through-current barely flows to inverter 13.

Next, the function of transmission gate 11 will be discussed. When the potential at node S1 rises to $V_{CC}$, the potential at node S4 is lower than $V_{CC}$, i.e., reverse current flows to the source (node S4) from the drain (node S1) of the p-channel MOS transistor constituting inverter 12. Therefore, transmission gate 11 is placed between inverter 12 and reference voltage generating circuit 10 to prevent current reversal via transmission gate 11 turning OFF when node S1 rises to the $V_{CC}$ level.

FIG. 3 is the simulation result of the relationship between the through-current, output signal $V_O$, and input voltage $V_I$ of input circuit 1 of FIG. 1. In FIG. 3, the horizontal axis indicates the input voltage value (units: V), and the vertical axis indicates the output voltage value (units: V) and the through-current value (units: mA).

When input signal $V_I$ approaches a level close to $V_{TG1}$, through-current starts to flow to inverter 20. The threshold value voltage of n-channel MOS transistor 11b is about 1 V, so that when input voltage $V_I$ approaches a level close to $V_{TG1}$, node S5 is connected to power supply voltage $V_{CC}$ through p-channel MOS transistor 11a, the p-channel MOS transistor of inverter 12, and the n-channel MOS transistor 11b. However, the p-channel MOS transistor constituting inverter 12 is completely ON, so that there is hardly any flow of current to reference voltage generating circuit 10 from power supply voltage $V_{CC}$. Also, at this time, a small amount of through-current begins to flow to inverter 12.

When input voltage $V_I$ rises and exceeds threshold value $V_{TG1}$ of inverter 20, inverter 20 logically inverts, and output voltage $V_O$ goes low. However, the p-channel MOS transistor and the n-channel MOS transistor comprising inverter 20 enter the intermediate ON state, so that a large through-current flows to ground from $V_{CC}$ through p-channel MOS transistor 15 and inverter 20. Also, the through-current flowing to inverter 12 increases with a rise in input voltage $V_I$.

When input voltage $V_I$ rises further and goes to about 2.4 V, inverter 12 logically inverts, node S1 goes low, and accordingly, inverter 13 logically inverts, node S2 goes high, and p-channel MOS transistors 14 and 15 are turned OFF. Then, the through-current of inverter 20 is restricted, becoming more or less 0 mA. Here, the threshold value voltage of inverter 12 is about 2.5 V, so that a slight through-current flows to inverter 12, even at the point in time through-current cannot flow to inverter 20.

As previously explained, even if a signal of about 2.5 V, which is the high logical level output at TTL level, is input to input circuit 1, through-current barely flows.

The through-current shown in FIG. 3 is based on a simulation, and in actual operation, it flows only for a moment during the change in input voltage $V_I$, and the power consumption is very low compared to the conventional input circuit when the input signal level in said input circuit 1 is about 2.5 V.

The foregoing operation noted above also applies to a case when input voltage $V_I$ changes from the high level $V_{CC}$ to lower level (0 v).

In the first embodiment of the input circuit as shown in FIG. 1, it is possible to create a configuration which suitably omits transmission gate 11 and p-channel MOS pull-up transistor 14 when the sizes of the p-channel and n-channel MOS transistors constituting inverters 12 and 13 are very small and through-current which flows is sufficiently small.

FIG. 4 shows the second embodiment of the input circuit in accordance with the present invention. This input circuit 2 was constituted as an input circuit only with through-current prevention circuit 21 of input circuit 1 of FIG. 1, and it is designed to connect the gate of p-channel MOS transistor 11a to the output of inverter 12. The operation of the input circuit of FIG. 4 will now be explained.

When input voltage $V_I$ gradually drops from the high level (logic value 1) and goes lower than threshold value voltage $V_{TG2}$ of inverter 12, output voltage $V_O$ goes high (logic value 1). Accordingly, inverter 13 logically inverts and node S2 goes low, p-channel MOS transistor 14 turns ON and must pull up output voltage $V_O$ to power supply voltage $V_{CC}$. Therefore, the input of inverter 13 goes fully high and through-current does not flow. At this time, transmission gate 11 turns OFF, so that current is not fed to inverter 12 and through-current does not flow.

The operation noted above also applies when input voltage $V_I$ makes a transition from the low level to the high level.

When high drive capacity and high speed operation are not needed, it is possible to simplify the circuit and realize an input circuit with low power consumption, as in the first embodiment of FIG. 1, by giving it the constitution of the second embodiment of the input circuit 2 shown in FIG. 4.

FIG. 5 shows the third embodiment of the input circuit in accordance with the present invention. This input circuit 3 comprises inverters 33 and 34, n-channel MOS transistor 32, and inverter 36 made of p-channel MOS transistor 30 and n-channel MOS transistor 31. Inverters 33 and 34 have higher threshold value voltages than inverter 36.

When the input voltage changes from the high level to the low level, inverters 33 and 34 have lower threshold value voltages than inverter 36, so that logical inversion is executed more slowly than for inverter 36, n-channel MOS transistor 32 is turned OFF, and the output voltage of inverter 36 restricts the through-current in the high level state.

This input circuit 3 is effective in restricting the through-current of inverter 36 when the input voltage is close to 0 V and the threshold value voltage of inverter 36 is close to $V_{CC}$ or power supply voltage.

FIG. 6 shows the fourth embodiment of the input circuit in accordance with the present invention. This input circuit 4 comprises inverters 33, 34, 41, and 42, n-channel MOS transistor 32, p-channel MOS transistor 40, and inverter 36 made of p-channel MOS transistor 30 and n-channel MOS transistor 31. Inverters 33 and 34 are set so that the threshold value voltage is lower than inverter 36, and inverters 41 and 42 are set so that the threshold value voltage is higher than inverter 36.

When the input voltage changes from the high level to the low level, inverters 33 and 34 have lower threshold value voltages than inverter 36, so that logical inversion is executed more slowly than for inverter 36, n-channel MOS transistor 32 is turned OFF, and the output voltage of inverter 36 restricts the through-current in the high level state.

When the input voltage changes from the low level to the high level, inverters 41 and 42 have higher threshold value voltages than inverter 36, so that logical inversion is executed more slowly than for inverter 36, p-channel MOS transistor 40 is turned OFF, and the output voltage of inverter 36 restricts the through-current in the low level state.

This input circuit 4 is effective for restricting the through-current of inverter 36 when the input voltage is close to 0 V or when the input voltage is close to $V_{CC}$ when the high level output voltage value of the input signal is more or less at the mid-point between power supply voltage $V_{CC}$ and 0 V.

Needless to say, various other configurations of the input circuit in accordance with the invention are possible, so that the respective embodiments of the input circuit as described herein and illustrated in the drawings are not to be construed as restricting the scope of the invention.

The invention can provide TTL compatible input circuits in which the operating speed and the drive capacity are high, and the power consumption is low by making the sizes of the p-channel MOS transistor and the n-channel MOS transistor comprising the inverter (buffer) which drives the logical circuit connected in the subsequent stage large and by constructing the input circuit in a manner providing a switching means for preventing through-current between the power supply and said inverter.

I claim:

1. An input circuit for providing a logic value output signal while preventing through-current flow when a high level logic signal is received as the input thereto, said input circuit comprising:

an input terminal for receiving a logic value input signal;

an inverter having an input and an output, the input of said inverter being connected to the input terminal and receiving the logic value input signal, said inverter having a particular threshold voltage and performing logic inversion on the logic value input signal in providing a logic value output signal at the output of said inverter; and a control circuit connected to said input terminal and to the input of said inverter via a node interposed in the connection between said input terminal and said inverter;

said control circuit monitoring the voltage of the logic value input signal as received by said input terminal and stopping the flow of current to said inverter in response to the voltage of the logic value input signal exceeding the threshold voltage of said inverter by a predetermined value.

2. An input signal as set forth in claim 1, wherein said control circuit is connected across said inverter, said control circuit being connected to said node interposed in the connection between said input terminal and said inverter and to a second node connected to said inverter on the output side thereof.

3. An input circuit as set forth in claim 2, wherein said control circuit comprises:

a reference voltage generating circuit;

a transmission gate circuit connected to the output of said reference voltage generating circuit;

first and second control inverters connected in series to each other;

said transmission gate circuit being connected to said first control inverter such that the reference voltage from said reference voltage generating circuit establishes a threshold voltage value for said first control inverter, said transmission gate circuit being connected to said node interposed in the connection between said input terminal and said inverter and to said second node connected to said inverter on the output side thereof;

a pull-up transistor adapted to be connected to a power supply voltage at its input and to a third node interposed in the serial connection between said first and second control inverters, said pull-up transistor having a control gate connected to a fourth node coupled to the output of said second control inverter; and a cut-off transistor having a control gate connected to the output of said second control inverter and being adapted to be connected to the power supply voltage at its input and being connected to said inverter at its output;

said cut-off transistor being controlled by the output of said second control inverter for cutting off the feeding of a power supply voltage to said inverter.

4. An input circuit as set forth in claim 1, wherein said control circuit comprises:

a reference voltage generating circuit;

a transmission gate circuit connected to said reference voltage generating circuit and to said inverter, said transmission gate circuit being respectively connected to first and second nodes connected to said inverter on the input and output sides thereof;

said first node being interposed in the connection between said input terminal and the input of said inverter;

said second node being connected to the output of said inverter;

said control circuit further including a pull-up transistor adapted to be connected to a power supply voltage and to a third node interposed in the connection between the output of said inverter and said output terminal;

a control inverter having an output connected to the control gate of said pull-up transistor and an input connected to a fourth node interposed in the connection between the output of said inverter and said output terminal;

said control inverter performing a logic inversion on the logic value output signal in response to the output voltage from said inverter being at a high value;

said pull-up transistor being responsive to the output of said control inverter and being rendered conductive when the output from said control inverter is at a low logic value such that the output voltage from said inverter is pulled up to power supply voltage; and said transmission gate circuit being rendered non-conductive in response to the output voltage at said first node being at a high logic value for stopping the flow of current to said inverter.

5. An input circuit as set forth in claim 1, wherein said control circuit comprises a pair of serially connected control inverters having higher threshold voltage values than the threshold voltage value of said inverter when the logic value input signal received at said input terminal is at a high level logic value.

6. An input circuit as set forth in claim 5, wherein said inverter comprises a pair of CMOS transistors having respective control gates and of first and second channel types and having their control gates connected together to form the input of said inverter for receiving the logic value input signal from said input terminal;

said input terminal being connected to the control gates of said CMOS transistors and to the input of said serially connected control inverters of said control circuit;

a switching transistor connected to said inverter and having a control gate connected to the output of said serially connected control inverters comprising the control circuit and being adapted to be connected to ground potential;

said first and second control inverters of said control circuit having lower threshold voltage values than said inverter when the logic value input signal received by said input terminal is in transition from a high level logic value to a low level logic value; and said switching transistor connected to the output of said serially connected first and second control inverters of said control circuit being rendered non-conductive in response to the logic inversion occurring at the output of said first and second serially connected control inverters of said control circuit.

7. An input circuit as set forth in claim 1, wherein said control circuit comprises first and second pairs of first and second control inverters disposed on opposite sides of said inverter;

said first pair of first and second control inverters having threshold voltage values lower than the threshold voltage value of said inverter and said second pair of first and second control inverters having threshold voltage values higher than the threshold voltage value of said inverter;

a first switching transistor connected to said inverter on one side of said inverter and a second switching transistor connected to said inverter on the other side of said inverter, said first and second switching transistors being of opposite channel conductivity and having respective control gates connected to the outputs of said first and second pairs of first and second control inverters of said control circuit respectively; and said first switching transistor being adapted to be connected to a power supply voltage and said second switching transistor being adapted to be connected to ground potential.

8. An input circuit as set forth in claim 7, wherein said inverter comprises a pair of serially connected CMOS transistors having respective control gates of opposite polarity and defining the input of said inverter for receiving the logic value input signal from said input terminal.

* * * * *